United States Patent [19]

Yamawaki et al.

[11] Patent Number: 4,894,707
[45] Date of Patent: Jan. 16, 1990

[54] SEMICONDUCTOR DEVICE HAVING A LIGHT TRANSPARENT WINDOW AND A METHOD OF PRODUCING SAME

[75] Inventors: Masao Yamawaki; Takashi Kondo, both of Itami, Japan

[73] Assignee: Mitsubishi Denki Kabushiki Kaisha, Tokyo, Japan

[21] Appl. No.: 155,598

[22] Filed: Feb. 12, 1988

[30] Foreign Application Priority Data

Feb. 12, 1987 [JP] Japan .................. 62-30551

[51] Int. Cl.⁴ .............................. H01L 21/56
[52] U.S. Cl. ........................... 357/74; 357/72; 437/209; 437/211; 437/213; 437/215
[58] Field of Search ............... 357/74, 72 B, 72; 437/209, 211, 213, 215

[56] References Cited

U.S. PATENT DOCUMENTS 4,697,203  9/1987  Sakai ....................... 357/74

FOREIGN PATENT DOCUMENTS 59-84448  5/1984  Japan .
60-113950  6/1985  Japan .

OTHER PUBLICATIONS

"The Development of the Molded Cavity Package with Optical Window" By Takashi Kondoh et al., IEEE Publication, pp. 47-52.

Primary Examiner—William D. Larkins
Assistant Examiner—David Soltz
Attorney, Agent, or Firm—Birch, Stewart, Kolasch, & Birch

[57] ABSTRACT

A semiconductor device having a light transparent window includes: a wall produced at an outer contour of a light receiving section on the surface of a semiconductor chip, the molding resin which is produced after a process of inserting the chip in a metal mold. The wall and the metal mold adhere with each other for producing a space between the chip and the metal mold so that a light transparent window is produced at a light introduction section in a separate position from the wall above the chip.

8 Claims, 5 Drawing Sheets

FIG. 1.a
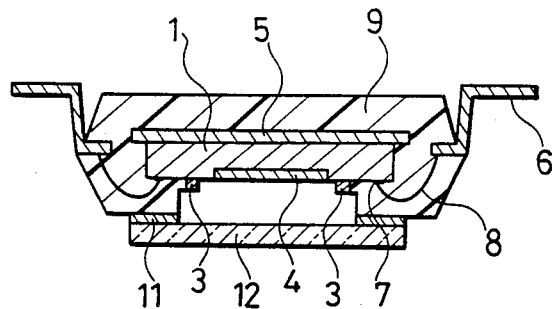
FIG. 1b
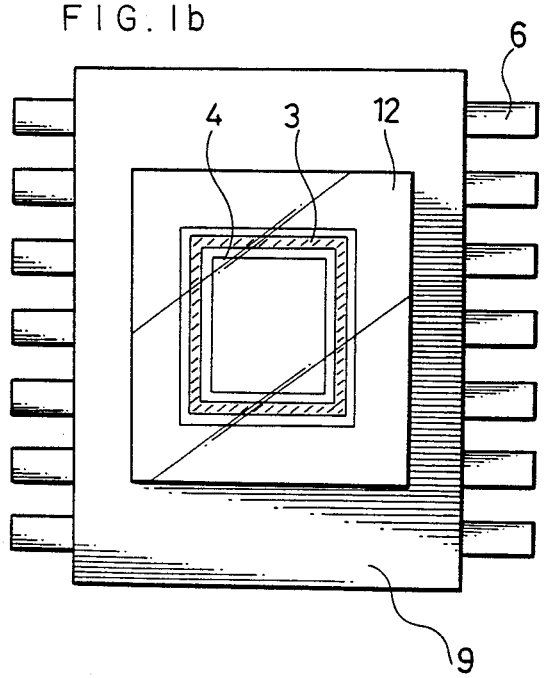
FIG. 1c
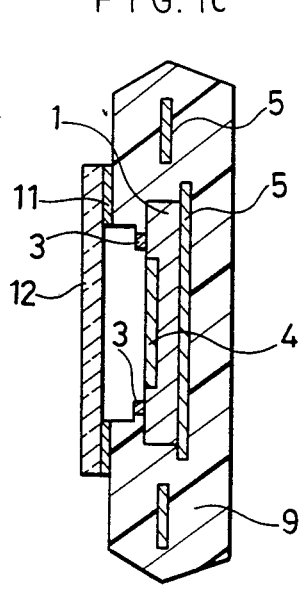

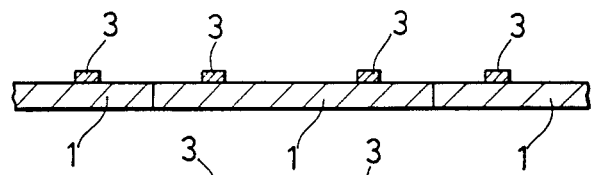

FIG. 3a
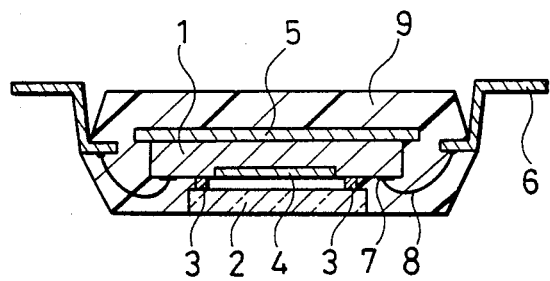
FIG. 3b
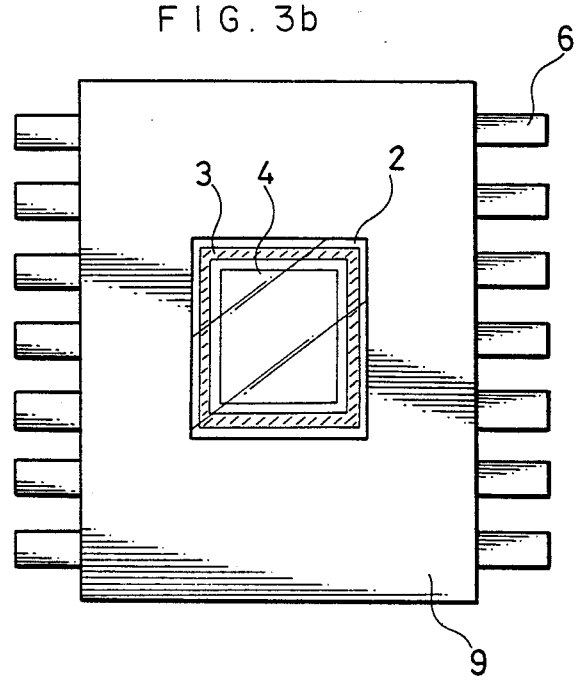
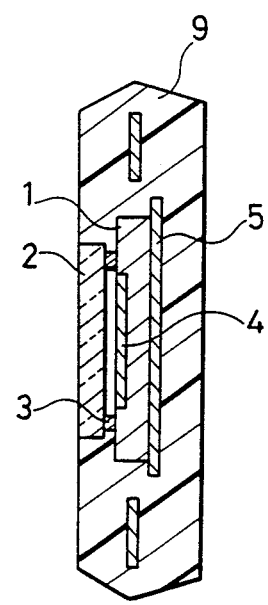
FIG. 3c

FIG.4.a
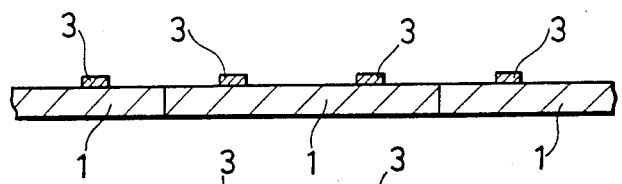
FIG.4b
FIG.4c
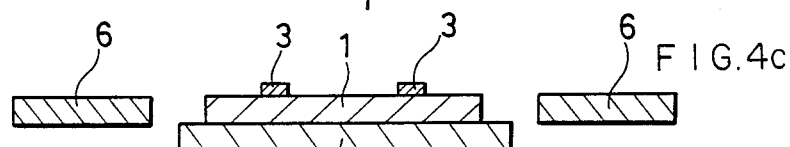
FIG.4d
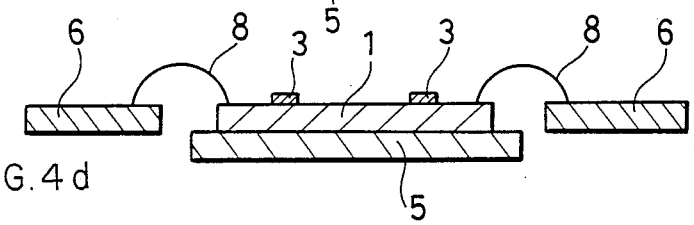
FIG.4e
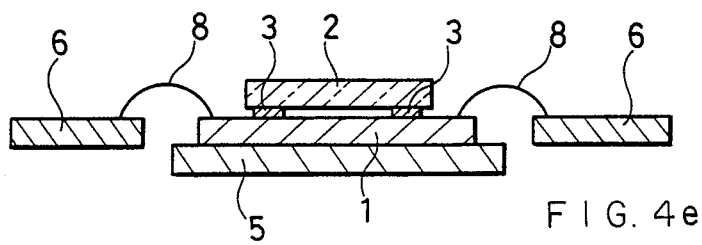
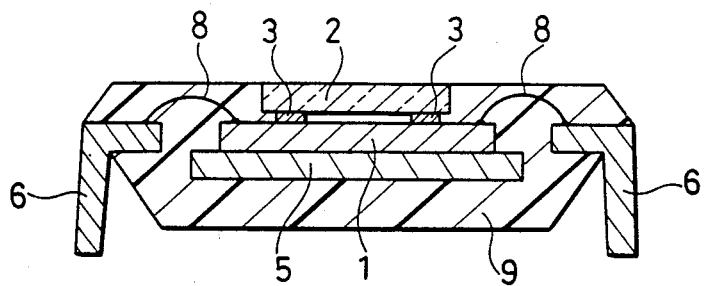
FIG.4f FIG. 5.a
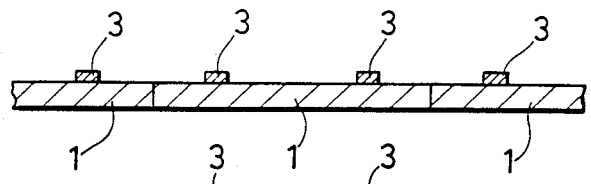
FIG. 5b
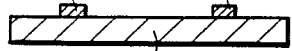
FIG. 5c
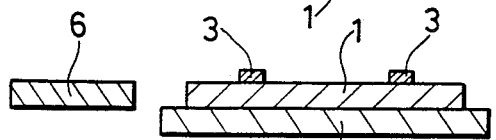
FIG. 5d
FIG. 5e
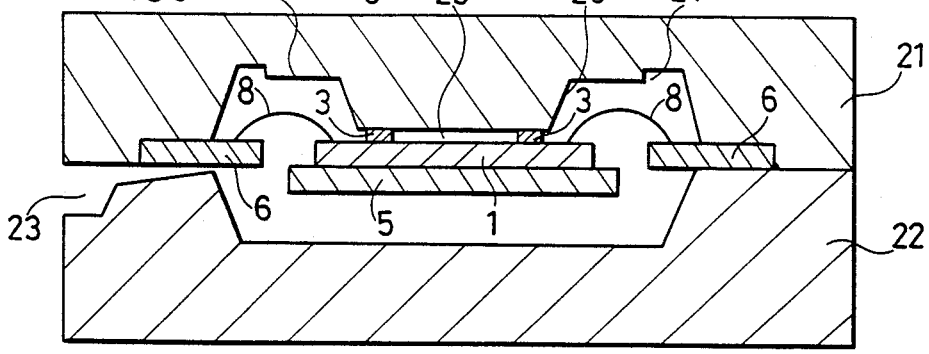
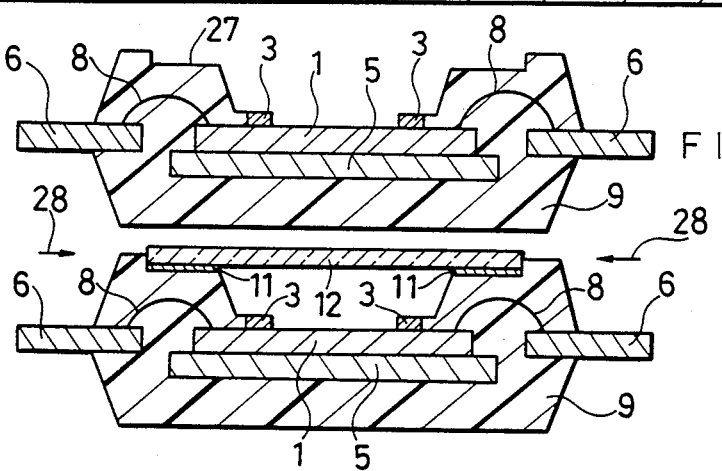
FIG. 5f
FIG. 5g ; # SEMICONDUCTOR DEVICE HAVING A LIGHT TRANSPARENT WINDOW AND A METHOD OF PRODUCING SAME

FIELD OF THE INVENTION

The present invention relates to a semiconductor device having a light transparent window and a method of producing the device, and more particularly to a method for enhancing the yield thereof.

BACKGROUND ART

FIG. 3 shows a structure of a prior art semiconductor device having a light transparent window.

In FIG. 3, the reference numeral 1 designates a semiconductor chip in which light detectors such as two dimensional image sensors are highly integrated. The reference numeral 2 designates a light transparent window made of glass, the numeral 3 designates a wall produced of silicon rubber, for example, by a screen printing process. The reference numeral 4 designates a light receiving section having integrated light detectors. integrated. The reference numeral 5 designates a die bonding frame, the reference numeral 6 designates legs produced of lead frames, the reference numeral 7 designates a bonding pad of the semiconductor chip 1, the reference numeral 8 designates a wire made of a gold or copper metal alloy, and the reference numeral 9 designates molding resin.

A method for producing the semiconductor device will be described briefly with reference to FIG. 4 which shows an example of a method for producing the semiconductor device of FIG. 3.

At first, a wall 3 is produced of silicon rubber, for example, by a screen printing process on a wafer (refer to FIG. 4(a)). Usually, this wall 3 has a width of several 10 to several 100 $\mu$m and a height of 5 to 50 $\mu$m. Next, scribing is conducted for cutting out the chip 1, and the chip 1 is die bonded onto the lead frame 5 (refer to FIG. 4(b)) and (c)). Thereafter, wire bonding is conducted so that the window 2 adheres to the semiconductor chip 1 (refer to FIG. 4(d)) and (e)). Usually, glass which is optically polished and has a thickness of about 1 mm is used for the window material 2, and a lead frame is used of about 100 to 200 $\mu$m thickness. Finally, a bending process of plastic molding is conducted to complete the legs of the semiconductor device (refer to FIG. 4(f)).

Herein, when an image sensor for a VTR camera is fabricated in the semiconductor chip 1, 200,000 to 400,000 light detectors having light detectors a square dimension of 10 $\mu$m are integrated at the light detection section 4.

In the prior art semiconductor device having a light transparent window of such a construction, when flaws or dust are attached to the lower surface of the window (a surface close to the side of the chip), black flaws appear in the imaged screen. Because flaws or dusts make a shadow or cover a portion of the light receiving surface of the light detector due to the distance between the window material, the light detector is short as or equal to the distance determined by the thickness of the window material, that is, about several 10 $\mu$m. Accordingly, even if the size of the flaws or dust is relatively as small as about 10 $\mu$m, they appear as black flaws, and this lowers the yield of an image sensor eminently.

SUMMARY OF THE INVENTION

An object of the present invention is to provide a semiconductor device having a light transparent window and a method for producing the device that is capable of suppressing a reduction in the yield due to flaws or dust at the glass surface.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, a portion corresponding to a space between a chip and a light transparent window is created when producing the molding resin by making a metal mold adhere to a wall. Thereby, a light transparent window is produced at the final process. Thus, a light transparent window is arranged sufficiently apart from a semiconductor chip which includes a light electricity conversion section, and defects caused by dust or flaws at the glass surface become difficult to be recognized, thereby enhancing the yield.

BRIEF DESCRIPTION OF THE DRAWINGS

The present invention will become more fully understood from the detailed description given hereinbelow and the accompanying drawings which are given by way of illustration only, and thus, are not limitative of the present invention, and wherein:

FIG. 1 is a cross-sectional view showing a semiconductor device having a light transparent window in one embodiment of the present invention;

FIG. 2 is the cross-sectional view showing a process for producing the device of FIG. 1;

FIG. 3 is a cross-sectional view showing a prior art semiconductor device having a light transparent window;

FIG. 4 is the cross-sectional view showing a process for producing the device of FIG. 3; and FIG. 5 is a cross-sectional view showing a process for producing a semiconductor device having a light transparent window in a second embodiment of the present invention.

DETAILED DESCRIPTION OF THE PREFERRED EMBODIMENTS

In order to explain the present invention in detail, reference will be particularly made to FIG. 1.

FIG. 1 shows a semiconductor device having a light transparent window in one embodiment of the present invention. In FIG. 1, the same reference numerals designate the same elements as those in the prior art device. The reference numeral 12 designates glass window material, and the numeral 11 designates an adhesion portion which adheres the glass window material 12 to the molding resin 9.

The process for the production method of the semiconductor device will be described with reference to FIG. 2.

At first, the wall 3 is produced of silicon resin or silicon rubber by a screen printing process on a wafer (refer to FIG. 2(a)). Next, the chip 1 is scribed, cut out, and die bonded onto the lead frame, and thereafter wire bonding is conducted (refer to FIG. 2(b) to (d)). Next, the chip 1 is inserted into the molding metal molds 21 and 22 as shown in FIG. 2(e), and molding resin 9 is injected into the space 24 for forming the outer configuration of a package from the molding material injection aperture 23. In this molding resin 9 injection process, the wall 3 which produced by the above-described process is tightly adheres to the upper metal mold 21, and the molding resin 9 is not injected into the hollow section 25. After this molding resin 9 is injected, the chip 1 is taken out from the metal molds 21 and 22 (refer to FIG. 2(f)). The glass window material 12 adheres to the molding resin 9 by the adhesive material such as an epoxy system adhesive 11 (refer to FIG. 2(g)), and the legs are bent, thereby completing the semiconductor device as shown in FIG. 1.

In the semiconductor device produced as described above, it is possible to make a sufficient distance between the glass surface to which the light is incident 12 and the light detector of the chip 1. Therefore, even when flaws or dust of about several 10 $\mu$m in size adheres to the lower surface of the glass surface 12 (at the side of the chip surface), a shade does not appear on the chip surface and the flaws and dust become inconspicuous. Accordingly, by adopting such a structure in a VTR camera image sensor, black point flaws which have arisen in the prior art device arise less frequently, and this greatly contributes to an enhancement in the yield.

As an example, a shade of about 10% brightness is difficult to be recognized by the naked eye of a human being if it only occupies a narrow space on an imaged screen. Accordingly, it is sufficient to design a metal mold 21 having a distance between the glass surface 12 and the light detector of the chip 1 so that the shade only affects an influence of lower than 10% brightness against the size of flaws or dust which are suppressed at the glass surface 12. The distance between the chip 1 and the glass surface 12 may be larger than 100 to 500 $\mu$m as a criterion when dust of 10 to 20 $\mu$m in size adheres. Actually, it is desirable to make the distance of about 1 mm. Furthermore, the glass window material for the glass plate 12 is optically polished for use and there is no necessity of using a special glass plate.

In the above-illustrated embodiment, the metal mold for producing the hollow section 21 has a rectangular portion for producing a space between the chip 1 and the window material 12. It is possible, however, to make it easy to take out the chip from the metal mold after producing the molding resin by using a metal mold 21 which has a tapered configuration at this space producing portion 26 as shown in FIG. 5.

Furthermore, the working environment is assumed to be subjected to a temperature cycle from high temperature to low temperature or from low temperature to high temperature when using a molding resin package. Therefore, a stress 28 applied to the inside may arise in the glass window material 12 as shown in FIG. 5., and the package itself may warp. When a step 27 is provided on the metal mold 21 and a portion or the entire glass window 12 adheres to the molding resin 9 which is sunk therein as a solution for releasing this stress 28, the stress 28 will be absorbed by the glass window 12 and the warping of the package is prevented (refer to FIG. 5(d)).

As is evident from the foregoing description, according to the present invention, a portion corresponding to a space between a chip and a light transparent window is created when producing the molding resin by making a metal mold adhere to a wall. Thereby, a light transparent window is arranged sufficiently apart from a semiconductor chip which includes a light electricity conversion section. Thus, defects caused by dust or flaws at the glass surface are made difficult to be recognized, and thus the yield of the device is enhanced. Furthermore, the light transparent window material may be made of a common optically polished glass plate, thereby making the device at a low cost.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device having a light transparent window, comprising:
   a semiconductor chip having a light receiving section formed on a portion of a first surface of said semiconductor chip;
   a wall disposed on said first surface of said semiconductor chip surrounding said light receiving section;
   a molding resin formed to predetermined dimensions over the surfaces of said semiconductor chip excluding said portion of said first surface having said light receiving section formed thereon for forming an opening in said molding resin to said light receiving section; and
   a light introduction section formed by attaching the light transparent window to said molding resin over said opening, said semiconductor chip being separated from the light transparent window by a distance determined by said predetermined dimensions of said molding resin.

2. A semiconductor device having a light transparent window as defined in claim 1, wherein said distance between said semiconductor chip and said light transparent window is greater than 100 $\mu$m.

3. A method of producing a semiconductor device having a light transparent window, comprising the steps of:
   forming a light receiving section on a first surface of a semiconductor chip;
   disposing a wall on said first surface of said semiconductor chip surrounding said light receiving section;
   inserting said semiconductor chip in a metal mold so that said wall adheres to said metal mold, said metal mold having an injection aperture;
   injecting a molding resin into an injection aperture of said metal mold so that an opening in said molding resin is formed between said semiconductor chip and said metal mold;
   removing said metal mold so that a package of said molding resin is formed having said opening around said wall of said semiconductor chip; and
   attaching a light transparent window to said molding resin over said opening to form a light introduction section, said semiconductor chip being separated from the light transparent window by a distance determined by the dimensions of said metal mold.

4. A method of producing a semiconductor device having a light transparent window as defined in claim 3, wherein said metal mold includes means for forming a step in a portion of said molding resin for receiving said light transparent window.

5. A method of producing a semiconductor device as defined in claim 3, wherein said wall is disposed on said first surface by a screen printing process.

6. A method of producing a semiconductor device as defined in claim 3, wherein said metal mold comprises an extension having a length greater than 100 μm for forming said opening when said molding resin is introduced.

7. A semiconductor device having a light transparent window as defined in claim 1, wherein the light transparent window comprises a glass material.

8. A semiconductor device having a light transparent window as defined in claim 1, wherein said molding resin comprises a step in an area surrounding said opening for receiving said light transparent window.

* * * * *